United States Patent [19]
Ghia et al.

[11] Patent Number: 5,883,852
[45] Date of Patent: Mar. 16, 1999

[54] CONFIGURABLE SRAM FOR FIELD PROGRAMMABLE GATE ARRAY

[75] Inventors: Atul V. Ghia, San Jose; Paul Takao Sasaki, Sunnyvale, both of Calif.

[73] Assignee: DynaChip Corporation, Sunnyvale, Calif.

[21] Appl. No.: 28,956

[22] Filed: Feb. 23, 1998

[51] Int. Cl.$^6$ .............................. G11C 8/00; G11C 16/04
[52] U.S. Cl. .............................. 365/230.05; 365/230.02; 365/189.02
[58] Field of Search .................. 365/230.02, 230.03, 365/230.05, 189.02, 189.08, 154, 156

[56] References Cited

U.S. PATENT DOCUMENTS

| | | | |
|---|---|---|---|
| 5,500,609 | 3/1996 | Kean | 365/189.08 |
| 5,563,829 | 10/1996 | Huang | 365/230.03 |
| 5,614,844 | 3/1997 | Sasaki et al. | 326/84 |

*Primary Examiner*—David Nelms
*Assistant Examiner*—Trong Phan
*Attorney, Agent, or Firm*—Ronald C. Fish; Falk & Fish

[57] ABSTRACT

A configurable SRAM for a field programmable gate array. Two memory arrays each have a data input, a data output, a write enable input and port A and B address inputs. First and second address buses are selectively coupled to the port A and port B address inputs through multiplexers such that different configurations can be achieved. The multiplexers are controlled by a dual port/single port steering signal and a x1/x2 steering signal such that the following configurations can be achieved: 32 x1 dual port; 32 x1 single port and 16 x2 single port. In dual port configurations, simultaneous read and write operations to different cells can occur. In x2 configuration, each array is operated as an independent memory with its own address input, its own data output and its own data input. In x1 single port configuration, one data input line and one data output line and one address bus are shared between the two arrays, and an extra address bit is used to steer the write enable signals and the output multiplexer circuitry such the write enable signal reaches the proper array and the data output from the array being read reaches the shared output line.

6 Claims, 7 Drawing Sheets

32 X 1 DUAL PORT CONFIGURATION

FIG. 2 32 X 1 DUAL PORT CONFIGURATION

16 X 2 SINGLE PORT CONFIGURATION

16 X 2 SINGLE PORT CONFIGURATION
PORT A ONLY [A₀ [0:3] - 2 OUTPUTS

FIG. 6  32 X 1 SINGLE PORT CONFIGURATION

32 X 1 SINGLE PORT CONFIGURATION

CONFIGURABLE SRAM FOR FIELD PROGRAMMABLE GATE ARRAY

FIELD OF USE

The invention pertains to the field of field programmable gate arrays with static RAM in logic blocks which is configurable to different configurations.

BACKGROUND OF THE INVENTION

In FPGAs, it is useful to have static RAM in the logic blocks. Sometimes this RAM is used for general purposes and only needs to have a single port. In other instances, to give the designer greater flexibility to implement FIFOs, the SRAM needs to have dual port capability so that simultaneous read and write operations using two different ports can be accomplished. In other instances, a logic block has more memory cells than are needed, but the designer can use all the cells if the memory could be split into two separate RAM memories, each with its own I/O address and data inputs and data output, and each configured to be single port.

Thus a need has arisen for a SRAM architecture which can be switched between dual port and single port configurations, and which can be either a x1 configuration where all cells are unified in a single memory or a x2 configuration where the memory cells available are split into two separate RAMs, each single port and each with its own I/O.

SUMMARY OF THE INVENTION

According to the teachings of the invention, there is disclosed a species of configurable SRAM for FPGAs within the genus of the invention. The genus of the invention is defined as any circuit that has: two separate RAM memory arrays; with suitable switching circuitry to implement dual port or single port operation where, in dual port operation, both memory arrays are used as a single memory array and simultaneous read and write operations to different memory cells can be carried out via the two ports, or single port operation where only one read or write operation can occur at any particular time through the single port; suitable switching circuitry such that in single port operation either x1 or x2 configuration can be selected with x1 operation being defined as both memory arrays being used as a single memory array with a single output and a single I/O port, and x2 operation defined as using the two separate memory arrays as two separate memories with separate outputs for each memory array and separate address and data inputs for each memory array. Certain control signals can be either shared or separate in x2 configuration.

In the particular species within this genus disclosed herein, suitable switching circuitry is provided to operate two 16 bit arrays of CMOS dual port SRAM cells in any of the following configurations: 32 x1 (x1 configuration with 32 available bits) dual port (simultaneous read and write possible); 32 x1 single port (32 bits and single port such that simultaneous read and write not possible); or 16 x2 single port (two arrays operated as two separate, independent memories with no simultaneous read and write possible to either memory since only one set of address lines is available which is being switched between the two arrays—each array can be read or written, but not both simultaneously, when the address lines are switched to it).

DETAILED DESCRIPTION OF THE PREFERRED AND ALTERNATIVE EMBODIMENTS

Figure 1:
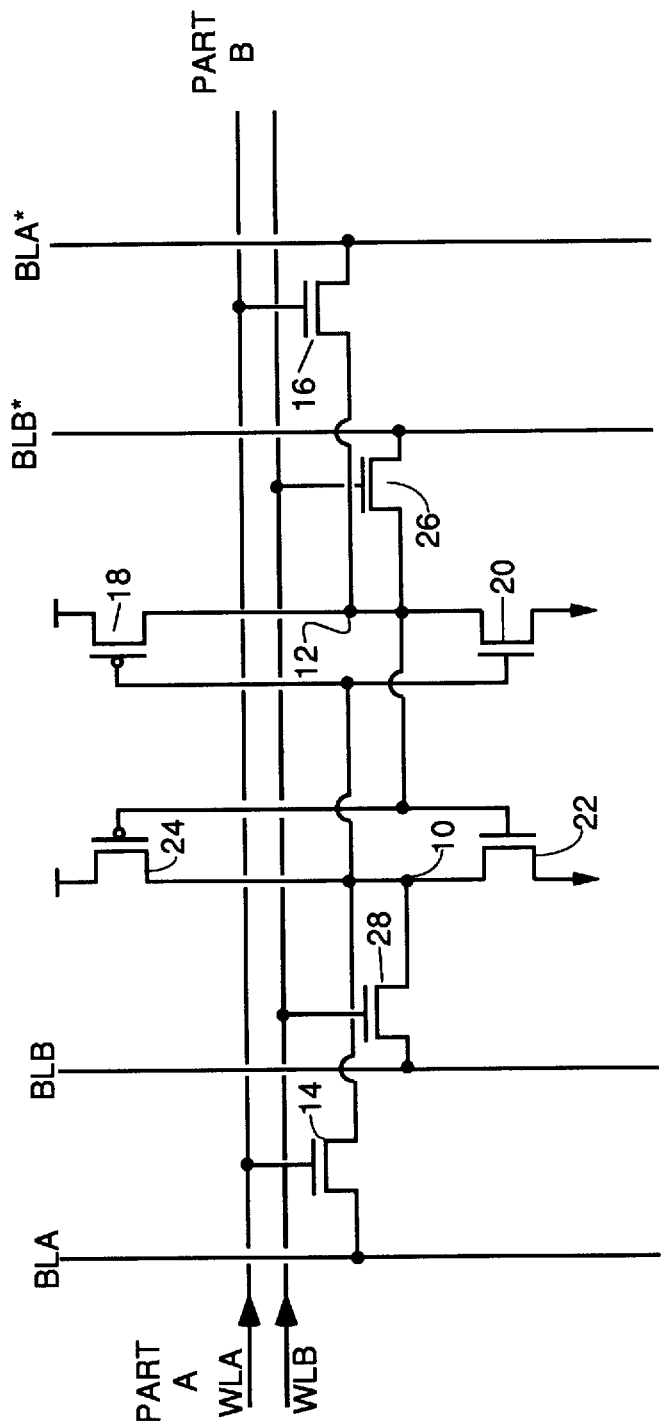
FIG. 1 is a diagram of a dual port CMOS SRAM cell which is used to make up the memory blocks of the configurable memory for an FPGA.

Referring to FIG. 1, there is shown an example of a dual port CMOS static RAM cell such as can be used for the memory cells in the configurable FPGA memory according to the teachings of the invention. Charge stored on nodes 10 and 12 defines whether the memory cell stores a 1 or 0. The memory cell is called dual port because it has two separate word lines designated WLA and WLB, each driven by a separate address decoder. In dual port configuration, both of these word lines are used. In single port configuration, either can be used, but in the example given in FIGS. 2–4, only WLA is used in single port configuration. WLA is associated with a pair of bit lines BLA and BLA*, and together with the address lines (not shown) coupled to the inputs of a decoder (not shown) that drives WLA, these lines comprise port A. WLB is associated with a pair of bit lines BLB and BLB*, and together with the address lines (not shown) coupled to the inputs of a decoder (not shown) that drives WLB, these lines comprise port B.

To write data to the memory cell using port A, the proper address bits are put on the address lines to cause the decoder to raise WLA. This turns on transistor 14 thereby connecting the bit line BLA to the gates of CMOS pair transistors 18 and 20 and the drain and source, respectively, of CMOS transistors 22 and 24. Raising WLA also turns on transistor 16 which connects bitline BLA* to the drain and source of CMOS transistors 20 and 18 and the gates of transistors 24 and 22. Whatever data is driven onto bitlines BLA and BLA* will then be stored in the cell. Similar write operations can be performed using port B by raising WLB and turning on transistors 26 and 28 thereby making similar connections for the port B bit lines BLB and BLB*.

Read operations through either port A or port B are performed identically except that instead of driving data onto the bit lines, the bit lines are coupled to sense amplifiers to read the state of charge of nodes 10 and 12.

Figure 2:
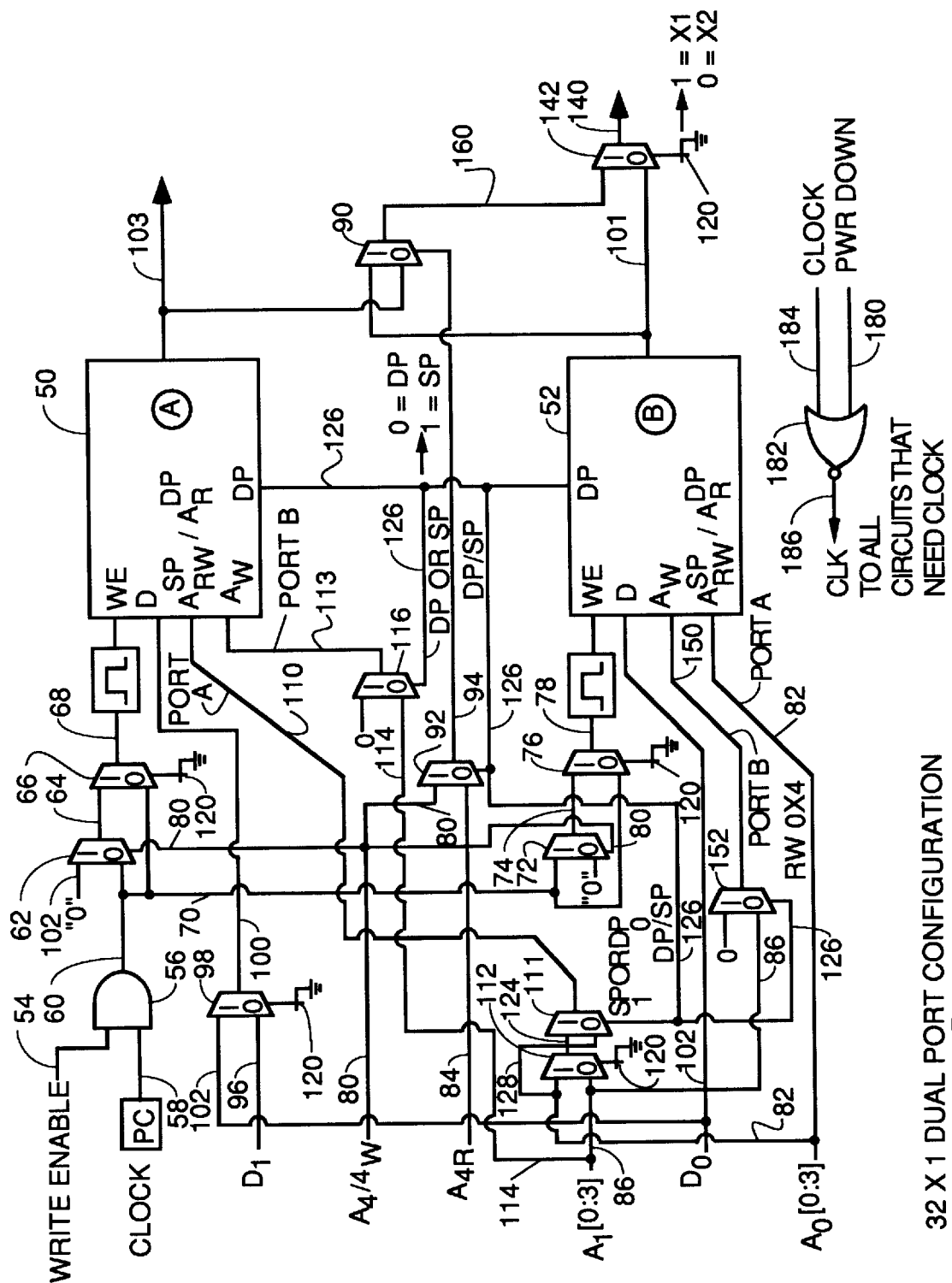
FIG. 2 is a schematic diagram of the configurable memory system of the invention as configured for 32 x1 dual port operation.

Referring to FIG. 2, there is shown a schematic diagram of a species of configurable SRAM within the genus of the invention. FIG. 2 is an exemplary circuit configured for dual port operation. The two separate memory arrays are shown as 50 and 52. The circuit is comprised of a plurality of multiplexers coupled together in such a way that by manipulation of two control signals, the configuration of the SRAM can be changed between the possible configurations given below in Table 1. The two control signals are the x1/x2 select signal and the DP/SP control signal. These two control signals are coupled to the select inputs of various ones of the multiplexers to alter their switching states to achieve the desired configuration. The possible configurations and the corresponding states for these two control signals are given below in Table 1.

TABLE 1

| Configuration | x1/x2 state | DP/SP state | Simultaneous read/write? | Number of outputs |
|---|---|---|---|---|
| 32 × 1 dual port | logic 1 | logic 0 | Yes | One |
| 32 × 1 single port | logic 1 | logic 1 | No | One |
| 16 × 2 single port | logic 0 | logic 1 | No | Two |

Table 1

A Write Enable signal on line 54 is shared between the two arrays 50 and 52. It can be coupled to the write enable input of array 50 (marked WE) through AND gate 56 (to synchronize the Write Enable pulse with a clock signal on line 58), line 60, multiplexer 62, line 64, multiplexer 66 and wire 68. The Write Enable pulse can also be coupled to the write enable input WE of array 52 via AND gate 56, line 60, multiplexer 72, line 74, multiplexer 76 and line 78.

Array 52 address inputs are comprised of the single address bit $A_4/4_w$ on line 80 and the 4 address bits $A_0[0:3]$ (in the claims, address bits $A_0[0:3]$ are referred to as the first plurality of address bit inputs) on bus 82. The $A_4/4_w$ signal input on line 80 is referred to in the claims as the first steering signal input. In the claims, bus 82 is referred to as the port A address input of array 52. These address bits provide the read and write addresses for all single port configurations where this array 52 is being used and are used to supply address bits for one of the ports in the dual port configuration of FIG. 2. The array 52 data input line 102 is coupled to the data input D of array 52. The data output line for array 52 is line 101.

Array 50 address inputs are the single address bit $A_{4R}$ on line 84, single address bit $A_4/4_w$ on line 80 and the 4 address bits $A_1[0:3]$ on bus 86. The $A_{4R}$ signal input on line 84 is referred to in the claims as the second steering signal input. Address bus 86 is referred to in the claims as the second address bus and the $A_1[0:3]$ address bits are referred to as the second plurality of address bits. The $A_4/4_w$ bit and the $A_{4R}$ bit are inputs to a multiplexer the selection and connection of which through multiplexer 92 to line 94 and the logic state thereon controlling the switching state of output multiplexer 90. The array 50 data input line $D_1$, line 96, is coupled to the data input D of array 50 via line 100 and multiplexer 98, and the data output line of array 50 is line 103 from the sense amplifier inside array 50.

Both arrays 50 and 52 have address decoders inside them which receive the 5 address bits detailed above for each array and decode them to raise and lower the appropriate word lines and place the input data on the appropriate bit lines or connect the appropriate bit lines to the sense amplifiers. Each memory array 50 and 52 is arranged as an array having eight rows with two cells in each row.

For dual port operation, simultaneous read and write operations to different cells are allowed, each through a different port. This requires that the $A_0[0:3]$ address bits supply the address for port A and the $A_1[0:3]$ address bits supply the address for port B. The only dual port configuration available in the memory of FIG. 2 is 32 x1 where the two arrays are used as a single memory. The $A_4/4_w$ bit on line 80 is coupled to the select inputs of multiplexers 62 and 72 and is used to steer the Write Enable pulse on line 54 to whichever array 50 or 52 that contains the cell which is being written, if one of the simultaneous operations is a write. If array 52 contains the cell to be written, the $A_4/4_w$ bit is set to 1. This controls multiplexer 62 to connect a hardwired 0 on line 102 to wire 64 and controls multiplexer 72 to connect the Write Enable pulse on line 70 to the write enable input of array 52. If array 50 is to be written, $A_4/4_w$ is set to 0, and this reverses the connections of multiplexers 72 and 62 such that the Write Enable pulse on line 60 is guided to the write enable input of array 50 and the write enable port of array 52 receives a 0. Multiplexers 66 and 76 have their select inputs connected to a signal which has its logic state controlled in accordance with the memory is configured in x1 or x2 configuration. The difference between x1 configuration and x2 configuration is x1 configuration only has one output, line 140 (referred to in the claims as the shared output line), while x2 configuration means that the memory has two separate outputs, line 103 for array 50 and line 140 for array 52. The multiplexers 66 and 76, and some of the other multiplexers also, specifically, multiplexers 142, 112 and 98, have their select inputs coupled to symbols such as symbol 120. This symbol represents connection to a signal line which carries a x1/x2 logic signal which is logic 1 for the x1 configuration and logic 0 for the x2 configuration. All of the multiplexers have the convention that, if their select inputs receive a logic one, the top input will be connected to the output, whereas if their select inputs receive a logic 0, the bottom inputs are connected to the output line, the top input being defined as the input farthest from the FIG. 2 legend. The same is true for all the other figures herein. The x1/x2 switching control signal is on line 120 (not shown as a separate line but shown as a symbol at the switching control inputs of all the affected multiplexers) and controls switching by multiplexers 112, 66, 142, 98 and 76.

Bus 110 connected to the $A^{sp}_{rw}/A^{dp}_r$ input of array 50 is four address bits wide. In the claims this address bus 110 is referred to as the port A address input for array 50. These bits are decoded inside array 50 and result in raising to logic 1 the word line A, WLA for whatever cell is being addressed by these bits. For single port operation, these address bits are used for both read and write operations because only address port A is used in single port configurations to supply all addresses.

For dual port configurations, these address bits on bus 110 are supplied from the $A_0[0:3]$ A port address inputs through multiplexers 112 and 114 and are used only for read operations of cells in array 50. Write operations of array 50 during dual port operation only are done using bus 113 coupled to the $A_w$ input of array 50, the address bits on bus 113 being supplied via multiplexer 116, line 114 and the four $A_1[0:3]$ address bits. Multiplexer 116 has its select input controlled by a DP/SP signal on line 126 which is logic 0 for dual port or DP operation and logic 1 for single port or SP operation. In other words, the port A array 50, in dual port operation reads are done using the address bits $A_0[0:3]$ and write operations are done using the address bits $A_1[0:3]$. For write operations in dual port mode, bus 113 receives four address bits $A_1[0:3]$ via line 114 and multiplexer 116 and, after decoding of the address bits, is coupled to the port B word line WLB of the A array 50. In the claims, bus 113 is referred to as the port B address input of array 50.

In dual port configuration, 32 x1, both arrays 50 and 52 do read operations in tandem with the $A_0[0:3]$ address bits (Port A) supplying the read address for each array. More specifically, the $A_0[0:3]$ address bits are switched to the $A^{sp}_{rw}/A^{dp}_{r}$ input of array 50 in the following manner. The x1/x2 switching control signal on line 120 is set to logic 1 and causes multiplexer 112 to couple bus 82 to bus 124 so that the $A_0[0:3]$ address bits are coupled to the top or "1" input of multiplexer 114. The $A_0[0:3]$ address bits are also supplied to the lower or "0" input of multiplexer 114 via bus 128 which is an extension of bus 82 and which bypasses multiplexer 112. Multiplexer 114 is switched in accordance with a DP/SP switching control signal on line 126 which controls whether the SRAM configuration is single port or dual port. This DP/SP signal is logic 0 for dual port configuration, and this causes the lower input coupled to bus 128 to be coupled to bus 110 and the $A^{sp}_{rw}/A^{dp}_{r}$ input of memory array 50. Thus, the $A_0[0:3]$ address bits drive the internal decoder of array 50 and cause the proper word line A of the selected cell in array 50 to be raised for read operations. Array 52 performs read operations in the 32 x1, dual port configuration using whatever address bits are supplied to the $A_{rw}/A_r$ input via bus 82. Bus 82 is directly coupled to the $A_0[0:3]$ address bits.

In the 32 x1, dual port configuration, the x1 part of the configuration moniker means that both arrays 50 and 52 will share a single output line 140. The fifth address bit $A_{4R}$ is used to control which array's bit line from the selected cell being read drives the overall data output line 140 thereby providing enough address bits (five) to select among 32 cells. In the dual port configuration, the DP/SP switching control signal on line 126 controls multiplexer 92 to couple the $A_{4R}$ address bit on line 84 to the switching control signal line 94 of output multiplexer 90. This multiplexer has it's 0 input coupled to output line 103 of array 50 and has it's 1 input coupled to output line 101 of array 52. Thus, if the cell being read is in array 50, the $A_{4R}$ address bit is set to logic 0 and this couples line 103 to line 160. If the cell being read is in array 52, the $A_{4R}$ address bit is set to logic 1 which causes multiplexer 90 to couple output line 101 to line 160. Line 160 is coupled to the 1 input of multiplexer 142. This multiplexer has its switching control input coupled to the x1/x2 select signal, which is logic 1 for the 32 x1, dual port configuration. This causes multiplexer 142 to couple line 160 to the overall output line 140.

In the dual port 32 x1 configuration, address bits for write operations (Port B) in both array 50 and array 51 will be supplied by the address bits $A_1[0:3]$. For array 50, the address bits $A_1[0:3]$ will be supplied to bus 113 via bus 114 and multiplexer 116. Bus 114 is directly connected to the $A_1[0:3]$ address bits and to bus 86, and since switching of multiplexer 116 is controlled by the DP/SP switching control signal on line 126, which for dual port configuration is a logic 0, multiplexer 116 is switched to connect bus 114 to bus 113. For array 52, write operations are carried out using the address bits on bus 150 which are the $A_1[0:3]$ address bits on bus 86 by virtue of a multiplexer 152. In the claims, this bus 150 is referred to as the port B address input of array 52. This multiplexer has its switching control input coupled to the DP/SP signal on line 126 which is in logic 0 state for dual port configuration thereby causing multiplexer 152 to couple bus 86 to bus 150.

Gating of the Write Enable signal on line 54 to the WE inputs of arrays 50 and 52 is controlled by the state of the $A_4/4_w$ fifth address bit on line 80. If this address bit is a logic 1, the Write Enable signal is guided through multiplexers 72 and 76 to array 52 in the 32 x1 dual port configuration. If it is a logic 0, then the Write Enable signal is guided through multiplexers 62 and 66 to array 50.

Write operations of both arrays 50 and 52 in the 32 x1, dual port configuration share the same data input $D_0$ to receive the bit to be written to the selected cell. The $D_0$ data input for array 52 write operations in 32 x1, dual port configuration is directly connected to the D input of array 52. However, the $D_0$ input 102 is coupled to the D input of array 50 via multiplexer 98 and line 100. Multiplexer 98 receives the x1/x2 switching control signal on line 120 at its switching input which, in this x1 configuration is logic 1. This causes the $D_0$ input line 102 to be coupled to line 100. The D inputs of both arrays 50 and 52 are coupled to their bit lines.

For array 50 in the 32 x1 dual port configuration, the dual ports are bus 110 as Port A and bus 113 as Port B. For array 52 in the 32 x1 dual port configuration, the dual ports are bus 82 for Port A and bus 150 as Port B. In dual port configuration, Port A is dedicated to read operations only for both arrays and Port B is dedicated to write operations only for both arrays. In dual port configuration, the SRAM cannot do two simultaneous reads from different cells since both decoders coupled to the Port A address bits $A_0[0:3]$ will be decoding the same relative cell within their respective arrays. Likewise, in dual port configuration, simultaneous writes to different cells are not permitted since both arrays use the same address bits $A_1[0:3]$ for their write addresses so both arrays will decode the same relative cell.

Figure 3:
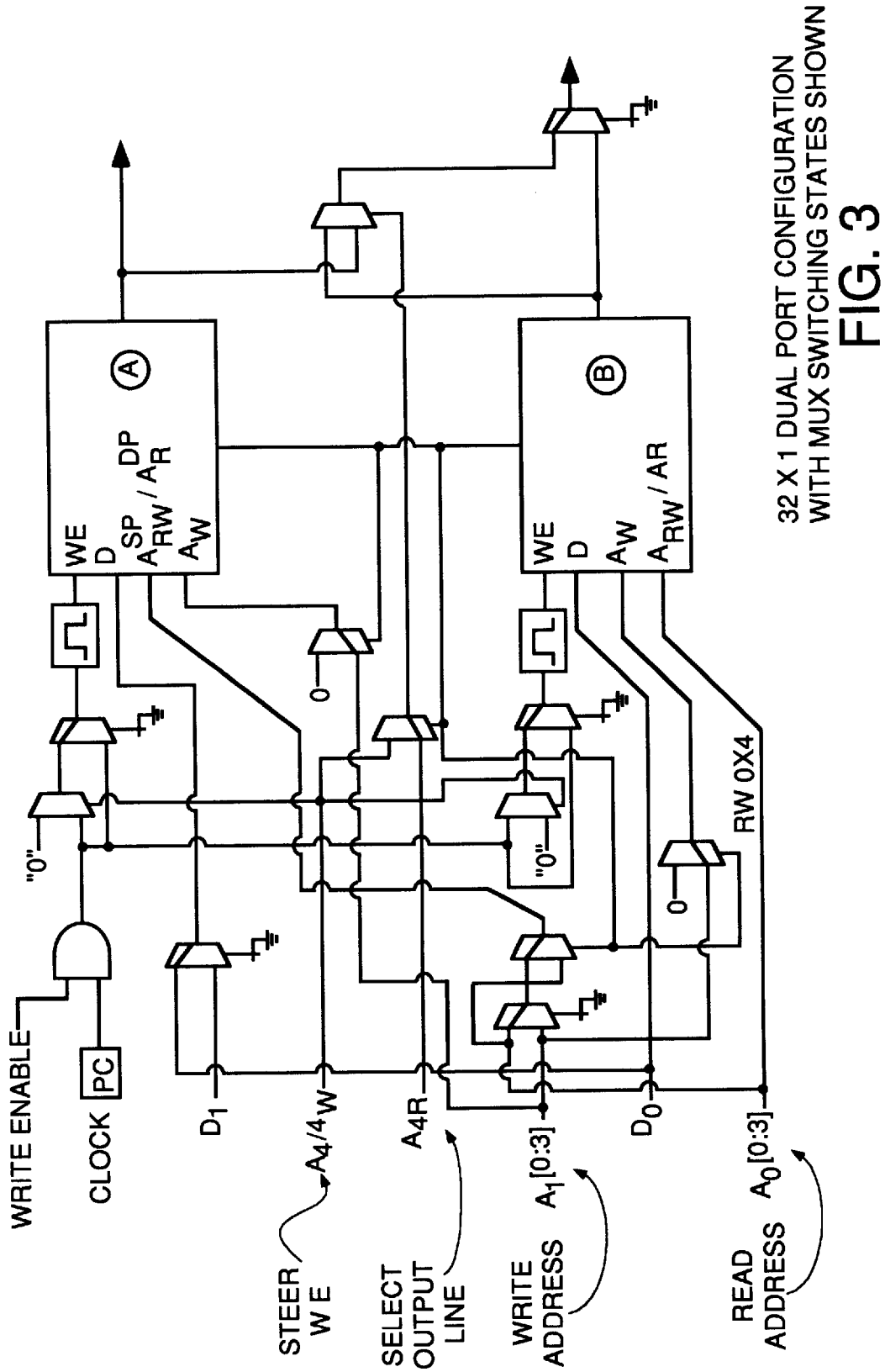
FIG. 3 is a diagram like FIG. 2 showing the actual connections through the multiplexers for the 32 x1 dual port configuration for those multiplexers whose switching states do not depend upon the address.

FIG. 3 shows the 32 x1 dual port configuration with the multiplexers that have fixed switching having their switching connections shown as lines drawn through the multiplexer symbol making the proper connection. Multiplexers whose states are switched in accordance with which cell is being read or written are shown with no lines drawn through their symbols.

Figure 4:
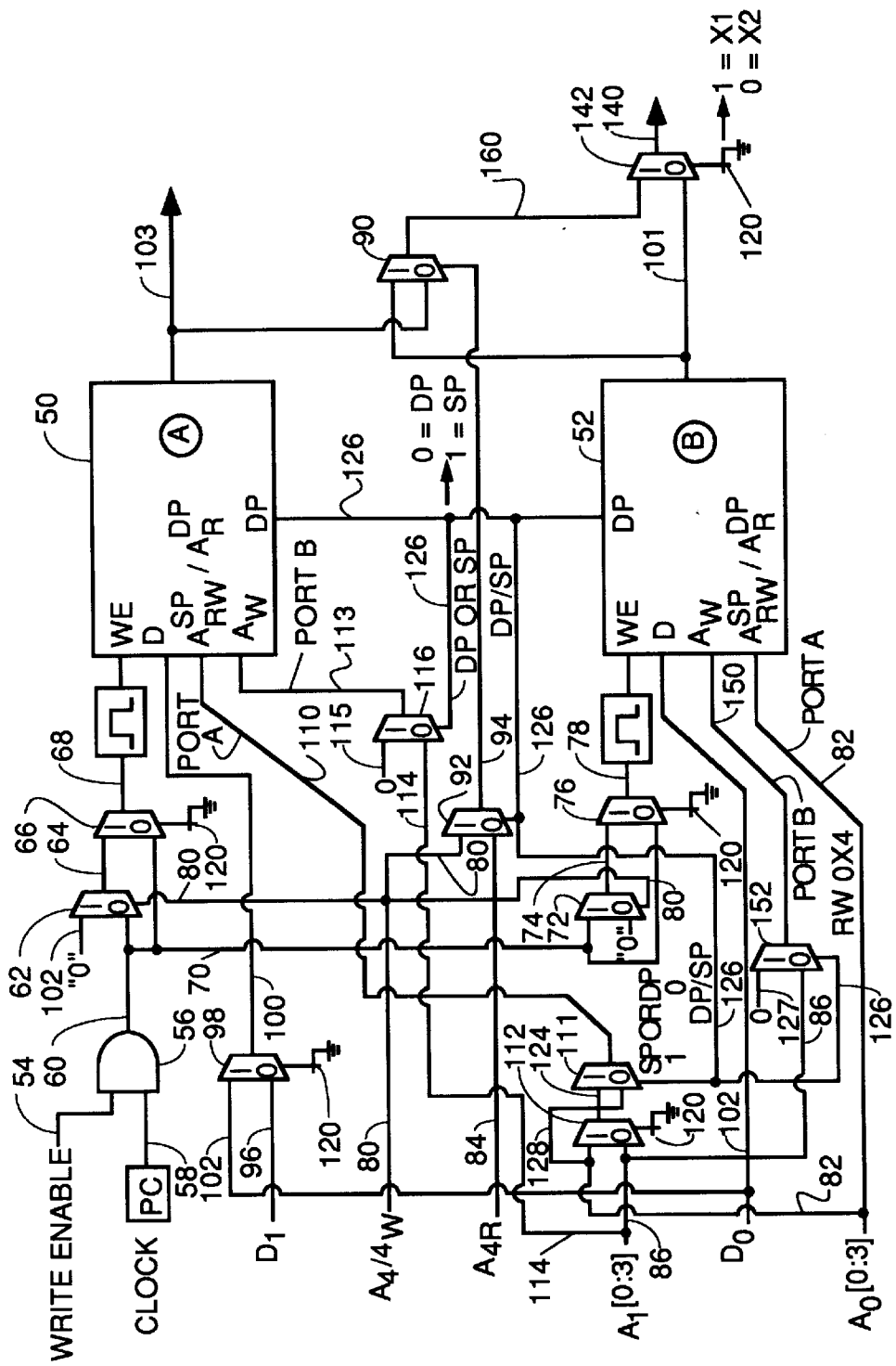
FIG. 4 is a schematic diagram of the configurable memory system of the invention as configured for 16 x2 single port operation.

Turning now to the 16 x2 single port possibility, this configuration is characterized by the two arrays 50 and 52 being used as separate memories, each with its own unshared address port and its own output. FIG. 4 will be used to discuss this configuration and FIG. 5 will illustrate the actual connections through multiplexers whose switching does not change while operating in this configuration. In this configuration, the arrays are used as separate memories with two separate outputs, and two separate address inputs. For array 52, only Port A address bits $A_0[0:3]$ are used and are coupled to the $A^{sp}_{rw}/A^{dp}_{r}$ address input via bus 82. For array 50, the address bits $A_1[0:3]$ are coupled to the $A^{sp}_{rw}/A^{dp}_{r}$ input via bus 86, multiplexer 112 and multiplexer 114 and bus 110. In the case of array 52, no switching is required, but, in the case of array 50, the address port connection is done by setting the DP/SP select signal on line 126 to logic 1 for single port operation and setting the x1/x2 select signal on line 120 to logic 0 for x2 operation. The logic 1 DP/SP signal on line 126 causes multiplexer 116 to connect line 115 to line 113 thereby disabling the write address inputs of array 50 since line 115 is hardwired to logic 0. Likewise, the Port B bus 150 is disabled by virtue of multiplexer 152 connecting it to bus 127 all lines of which are hardwired to logic 0 since this multiplexer also has its select input coupled to the DP/SP select control signal. The logic 0 state of x1/x2 causes multiplexer 112 to connect bus 86 to bus 124, and the logic 1 of the DP/SP signal on line 126 causes multiplexer 114 to couple bus 124 to bus 110 thereby coupling the $A_1[0:3]$ address input bits to array 50.

Figure 5:
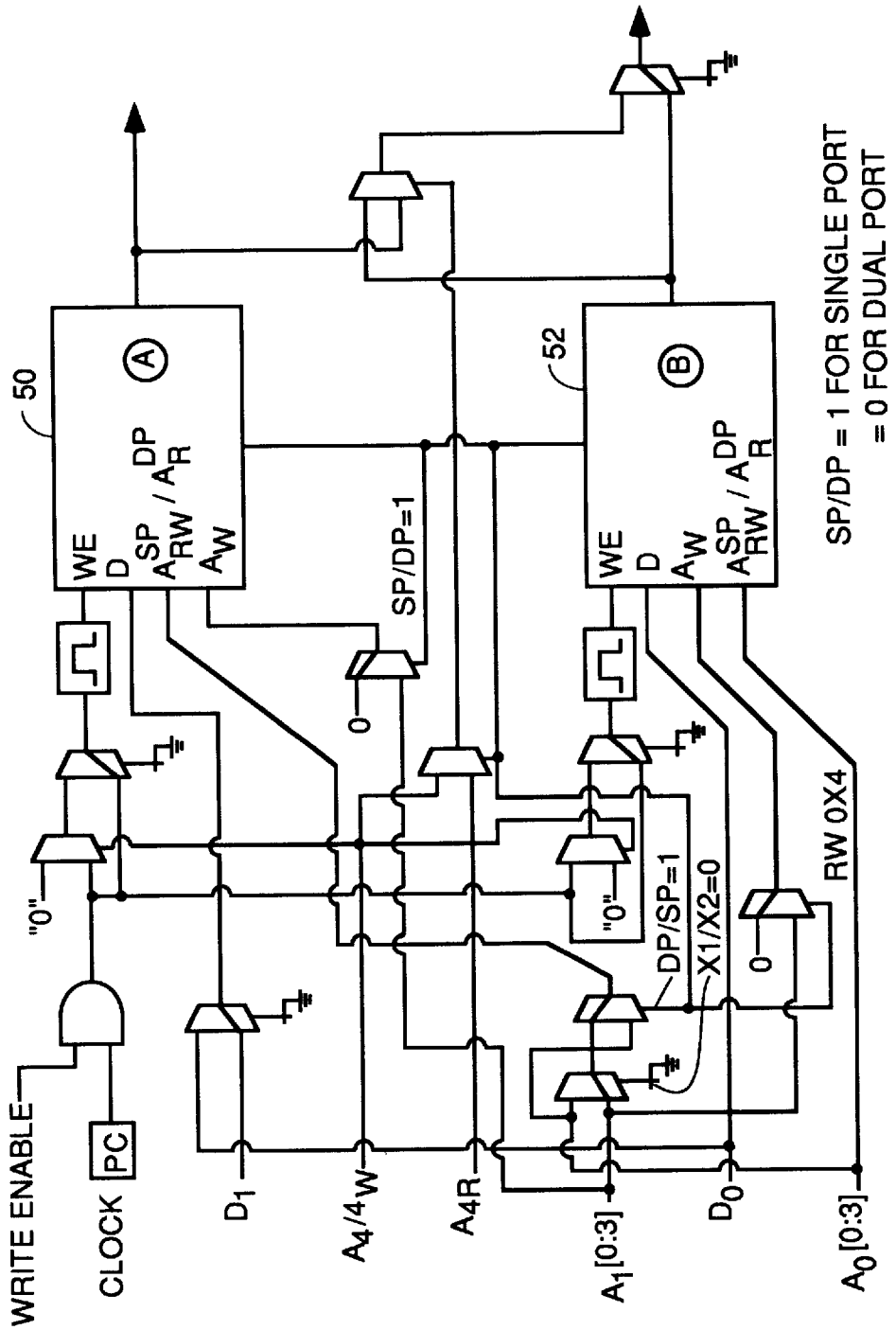
FIG. 5 is a diagram like FIG. 4 showing the actual connections through the multiplexers for the 16 x2 single port configuration for those multiplexers whose switching states do not depend upon the address.
Figure 6:
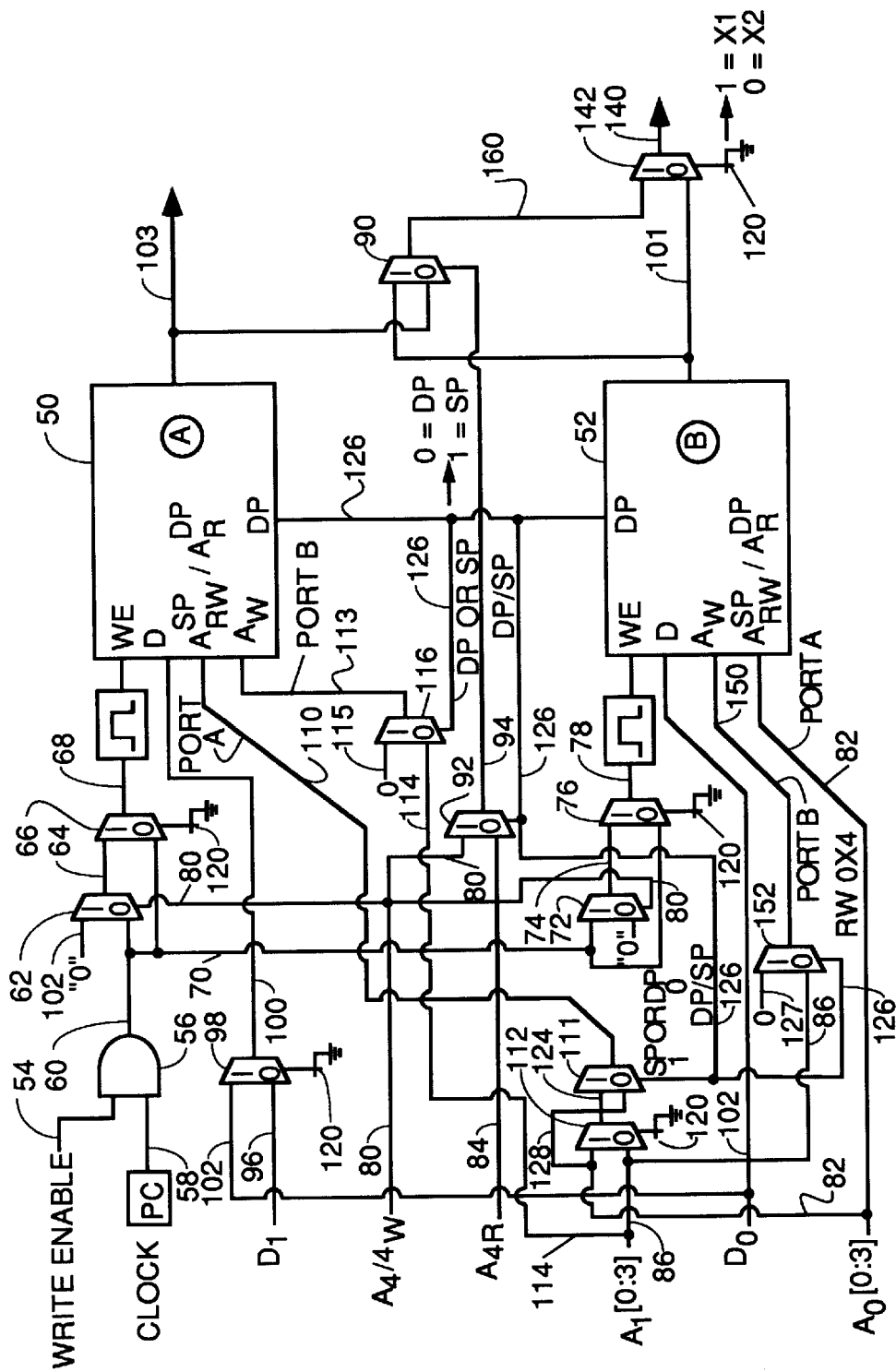
FIG. 6 is a schematic diagram of the configurable memory system of the invention as configured for 32 x1 single port operation.
Figure 7:
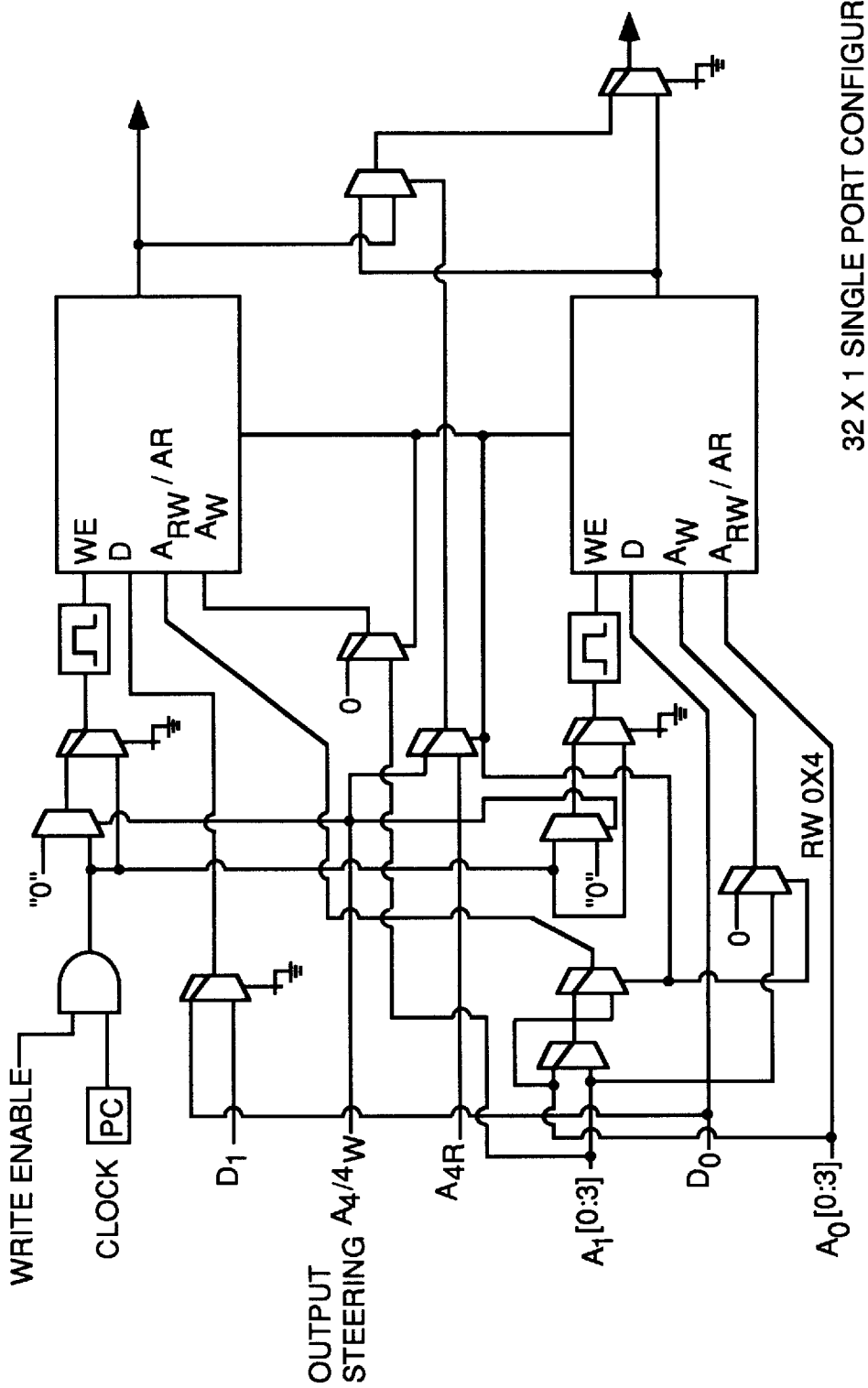
FIG. 7 is a diagram like FIG. 6 showing the actual connections through the multiplexers for the 32 x1 single port configuration for those multiplexers whose switching states do not depend upon the address.

In the 16 x2 single port configuration of FIGS. 4 and 5, each of the arrays 50 and 52 have their bit lines coupled to their own output lines. Array 50 has its bit lines coupled to line 103 for data output, and array 52 bit lines are coupled to line 101 which is coupled through multiplexer 142 to line 140 by virtue of the select input of multiplexer being coupled to the x1/x2 select signal on line 120, which is logic 0 for x2 configurations.

Write cycles for the 16 x2 single port configuration work as follows. The Write Enable signal on line 54 is steered to the WE inputs of both arrays 50 and 52 via the multiplexers 66 and 76 via lines 60, 68 and 78 since both multiplexers have selected their 0 inputs since their select inputs are coupled to the x1/x2 select signal which is logic 0. The data input for array 50 is the $D_1$ input on line 96. This data input is switched through multiplexer 98 to couple to line 100. The data input for array 52 is the $D_0$ input on line 102 which is coupled straight to array 52 input D.

Turning to the 32 x1 single port option, this configuration is characterized by use of a both arrays to access 32 bits but sharing a single output and only allowing a single read or write transaction to occur at any particular time. In this configuration, the x1/x2 select signal is set to logic 1 indicating a x1 state. This causes output multiplexer 142 to select its 1 input thereby coupling line 160 to ultimate output line 140. Line 160 is the output from multiplexer 90 which has as its inputs the output lines 101 and 103 from arrays 52 and 50. The select input of this multiplexer 90 is the output line from multiplexer 92 which has as its two inputs the address bits $A_4/4_w$ at the 1 input and $A_{4R}$ at the 0 input. The select input is coupled to the DP/SP signal on line 126 which is a logic 1 since single port operation is selected. This causes the $A_4/4_w$ logic bit on line 80 to be coupled to the select input of output multiplexer 92 via line 94 thereby allowing the $A_4/4_w$ logic bit to control whether it is the output of array 50 or the output of array 52 which drives the ultimate output line 140.

In the 32 x1 single port configuration, the address bits for the array 50 are the $A_0$[0:3] address bits. These address bits on bus 82 are coupled through multiplexer 112 to bus 124, and through multiplexer 114 to Port A bus 110 because of the logic states of the x1/x2 select signal being a logic 1 and the DP/SP select signal being a logic 1. The address bits $A_0$[0:3] are coupled directly to the address inputs of array 52 via bus 82. The port B address inputs on buses 150 and 113 for arrays 52 and 50, respectively, are disabled by virtue of multiplexers 152 and 116 both selecting their 1 inputs for coupling to the B address buses since the buses coupled to these 1 inputs are hardwired to logic 0. This happens because the select inputs of these two multiplexers are coupled to the DP/SP select signal which is at logic 1 for this single port configuration.

The data input for array 50 in the 32 x1 single port configuration is the $D_0$ input on line 102 and coupled through multiplexer 98 to line 100 and the D input of array 50 since the x1/x2 select control signal is logic 0. The $D_0$ data input is also directly connected to the data input of array 52. Thus, in the 32 x1 single port configuration, both arrays 50 and 52 share the same address bits and the same data input bit and their outputs are multiplexed onto a single output line.

Write cycles in the 32 x1 single port configuration work as follows. Multiplexer 66 has a logic 1 at its select input as does multiplexer 76 by virtue of both having their select inputs coupled to the x1/x2 select control signal. This causes line 64 to be coupled to line 68 and the write enable input of array 50, and couples line 74 to line 78 and the write enable input of array 52. This structure causes the $A_4/4_w$ to be in control of steering of the Write Enable signal. If the $A_4/4_w$ bit is a logic 1, the Write Enable signal is steered through multiplex 72 to array 52. If $A_4/4_w$ bit is a logic 0, the Write Enable signal is steered to array 50.

A fourth configuration is available to power down the SRAM when it is not in use to save power. This configuration is established by a power down bit. The power down configuration is useful to prevent the circuitry in the configurable SRAM from consuming power when it is not being used in a particular logic block. This prevents waste of power and generation of unnecessary heat in the chip which must be dissipated via the packaging. The principle behind the power down configuration is to use a PWR DOWN bit to hold the clock low so no transitions are occurring on the clock. When no clock transitions are occurring, no power is consumed in CMOS circuits. Any method of blocking the clock transitions will suffice to practice this invention. FIG. 2 illustrates the preferred embodiment where a NOR gate is used to implement the scheme. In this embodiment, a PWR DOWN bit on line 180 is coupled to one input of a NOR gate 182. A master clock line 184 is coupled to the other input. The output line 186 of the NOR gate is coupled to all circuits that need clock signals. When the PWR DOWN bit is a logic 1, the transitions of the clock signal on line 184 are blocked from reaching the master clock line 186. In some embodiments, the PWR DOWN signal is also used to block input data from reaching the address decoder or any data latches inside arrays 50 and 52.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A configurable SRAM memory array, comprising:

a first memory array having data, address and write enable inputs and a data output;

a second memory array having data, address and write enable inputs and a data output;

first and second steering signal inputs;

a x1/x2 steering signal input;

a dual port/single port signal input;

means coupled to said first and second steering signal inputs and to said x1/x2 steering signal input and said dual port/single port steering input and coupled to said inputs and outputs of said first and second memory arrays for selectively connecting said inputs and outputs to appropriate data, address and write enable signal inputs to establish selectability between an N x2 single port configuration, or a 2N x1 single port configuration, or a 2N x1 dual port configuration, where N is the number of bits stored in each of said first and second memory arrays.

2. A configurable SRAM which can be configured to any of a plurality of different predetermined configurations, comprising:

a first SRAM memory array having write enable, data, and port A and port B address inputs and a data ouput;

a second SRAM memory array having write enable, data, and port A and port B address inputs and a data ouput;

a shared output line;

an unshared output line coupled to the data output of said first SRAM memory array;

a first plurality of address bit inputs collected together as a first address bus;

a second plurality of address bit inputs collected together as a second address bus;

a first data input;

a second data input;

a write enable signal input;

a first steering signal input;

a second steering signal input;

a dual port/single port steering signal input;

a x1/x2 steering signal input;

address bus means coupled to said x1/x2 steering signal input and to said dual port/single port steering signal input, for selectively coupling said first and second address buses to said port A and port B address inputs of said first and second SRAM memory arrays such that configurations can be selectively achieved wherein said first address bus is coupled to both said port A address inputs of both said first and second SRAM memory arrays or wherein said first address bus is coupled to said port A address input of said second SRAM memory array and said second address bus is coupled to said port A address input of said first SRAM memory array;

data means coupled to said x1/x2 steering signal input, for selectively coupling said first and second data inputs to said data inputs of said first and second SRAM memory arrays such that configurations can be selectively achieved wherein said first address bus is coupled to the data input of both said first and second SRAM memory arrays or wherein said first data input is coupled to said data input of said second SRAM memory array and said second data input is coupled to said data input of said first SRAM memory array;

write enable steering signal means coupled to said x1/x2 steering signal input and to said first steering signal input for selectively coupling said write enable signal input to said write enable inputs of said first and second SRAM memory arrays such that a configuration can be achieved wherein said write enable signal input is selectively coupled to either the write enable input of said first SRAM memory array or the write enable input of said second SRAM memory array depending upon the logic state of said first steering signal input or wherein said write enable signal input is simultaneously coupled to said write enable inputs of both said first and second SRAM memory arrays simultaneously; and output steering means coupled to said dual port/single port steering signal input and said x1/x2 steering signal input and selectively coupled to first and second steering signal inputs, for selectively coupling said data outputs of either said first or second SRAM memory array to said shared data output so as to share said shared data output between both said first and second SRAM memory arrays in multiplexed fashion, or to selectively couple said data output of said second SRAM memory array to said shared data output in x2 configuration so that said shared data output serves as the output of said second SRAM memory array and said unshared data output serves as the data output of said first SRAM memory array.

3. A subsystem apparatus of a configurable memory array having first and second memory arrays, each of which has a port A address input and a port B address input, comprising:

a first address bus coupled to the port A address input of said second memory array;

a second address bus;

a x1/x2 steering signal input;

a dual port/single port steering signal input;

a first multiplexer having first and second inputs coupled to said first and second address buses and having an output and having a select input coupled to said x1/x2 steering signal input;

a second multiplexer having a first input coupled to said first address bus and having a second input coupled to the output of said first multiplexer, and having an output coupled to said port A address input of said first memory array, and having a select input coupled to said dual port/single port steering signal input;

a third multiplexer having a first input bus coupled to a voltage reference at logic 0 and having a second input coupled to said second address bus, and having an output coupled to said port B address input of said first memory array, and having a select input coupled to said dual port/single port input;

a fourth multiplexer having a first input bus coupled to a voltage reference at logic 0 and having a second input coupled to said second address bus, and having an output coupled to the port B address input of said second memory array, and having a select input coupled to said dual port/single port select input.

4. A subsystem apparatus of a configurable memory array having first and second memory arrays, each of which has a data input, comprising:

a first data input coupled to the data input of said second memory array;

a second data input;

a x1/x2 steering signal input; and a first multiplexer having a first input coupled to said first data input, and having a second input coupled to said second data input, and having an output coupled to said data input of said first memory array, and having a select input coupled to said x1/x2 steering signal input.

5. A subsystem apparatus of a configurable memory array having first and second memory arrays, each of which has a write enable input, comprising:

a write enable signal input;

a first steering signal input;

a x1/x2 steering signal input;

a first multiplexer having a first input coupled to a voltage reference at logic 0, a second input coupled to said write enable signal input, an output, and a select signal input coupled to said first steering signal input;

a second multiplexer having a first input coupled to said output of said first multiplexer, and having a second input coupled to said write enable signal input, and having an output coupled to said write enable input of said first memory array, and having a select signal input coupled to said x1/x2 steering signal input;

a third multiplexer having a first input coupled to said write enable signal input, a second input coupled to a voltage reference having a logic 0 level, an output, and a select signal input coupled to said first steering signal input;

a fourth multiplexer having a first input coupled to said output of said third multiplexer, and having a second input coupled to said write enable signal input, and having an output coupled to said write enable input of said second memory array, and having a select signal input coupled said x1/x2 steering signal input.

6. A subsystem apparatus of a configurable memory array having first and second memory arrays, each of which has a data output, comprising:

a first steering signal input;

a second steering signal input;

a dual port/single port steering signal input;

a x1/x2 steering signal input;

a first multiplexer having a first input coupled to said first steering signal input, a second input coupled to said second steering signal input, an output, and a select signal input coupled to said dual port/single port steering signal input;

a second multiplexer having a first input coupled to said data output of said first memory array, and having a second input coupled to said data output of said second memory array, and having an output, and having a select signal input coupled to said output of said first multiplexer;

a third multiplexer having a first input coupled to said output of said second multiplexer, and having a second input coupled to said output of said second memory array and having an output, and having a select signal input coupled to said x1/x2 steering signal input.

* * * * *